United States Patent [19]

Oechsner

[11] 4,310,759

[45] Jan. 12, 1982

[54] SYSTEM FOR REMOVAL OF MATERIAL FROM THE SURFACE OF A SAMPLE

[76] Inventor: Hans Oechsner, Am Dietrichsberg 9, 3392 Clausthal-Zellerfeld, Fed. Rep. of Germany

[21] Appl. No.: 139,089

[22] Filed: Apr. 10, 1980

[30] Foreign Application Priority Data

Dec. 14, 1979 [DE] Fed. Rep. of Germany ....... 2950329

[51] Int. Cl.³ ............................................. G01N 23/00
[52] U.S. Cl. .................................... 250/309; 250/281
[58] Field of Search ............................... 250/309, 281

[56] References Cited

U.S. PATENT DOCUMENTS 3,845,305 10/1974 Liebl .................................. 250/309
3,963,923 6/1976 Coles .................................. 250/309

*Primary Examiner*—Harold A. Dixon
*Attorney, Agent, or Firm*—Sprung, Felfe, Horn, Lynch & Kramer

[57] ABSTRACT

A system and method for removing material from the surface of a sample comprising: a high-frequency plasma produced in front of the sample surface; a metallic shield electrically insulated from the sample and provided with an opening determining the area to be removed, disposed between the sample and the high-frequency plasma. The parameters of this arrangement are chosen so that the relation $$U_2 = (U_1^{\frac{3}{4}} + D/C)^{4/3}$$

with $$C = \frac{4}{9}\left(\frac{\epsilon_o}{n}\right)^{\frac{1}{2}} \left(\frac{2}{e_o \cdot kT_e}\right)^{\frac{1}{4}}, \quad U_1 = \frac{kT_e}{2e_o} \ln \frac{M_i}{2\pi m_e}$$

holds, wherein:
$U_2$ = Potential difference applied between sample and plasma;
D = spacing of sample surface from shield;
$\epsilon_o$ = dielectric constant of vacuum;
n = density of plasma;
$e_o$ = elementary charge;
k = Boltzmann constant;
$T_e$ = electron temperature;p0 $M_i$ = atomic mass of the species of ions (plasma ions) used;
$m_e$ = electron mass; and
$\pi$ = 3.14.

3 Claims, 1 Drawing Figure

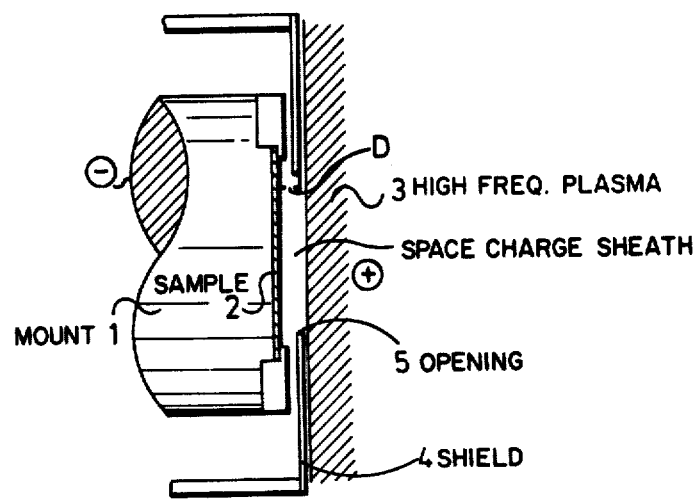

SYSTEM FOR REMOVAL OF MATERIAL FROM THE SURFACE OF A SAMPLE

BACKGROUND OF THE INVENTION

The invention relates to a system for the removal of material from the surface of a sample by the use of a high-frequency plasma produced in front of the sample surface.

From Applied Physics, vol. 14 (1977), pp. 43 to 47, it is known to sputter particles from the surface of a plane sample with the aid of a plasma and to subject these particles to chemical analysis by the use of a mass spectrometer. The plasma serves both for the formation of the ions producing the sputtering and for the post-ionization of the removed neutral particles which are analyzed with the mass spectrometer. Unlike the SIMS (Secondary Ion Mass Spectrometry) method, this known SNMS (Sputtered Neutral Mass Spectrometry) method permits quantitative determination of the chemical composition of the sputtered particles, and hence of the sample.

From the publication cited, there is further known a method of removing material from the surface of a sample in the form of atomic layers so as to permit depth-profile analysis. To obtain accurate results, the lateral removal of the material must proceed with extreme consistency, regardless of whether the particles or layers removed are analyzed by the SNMS or another surface-analysis method.

Uniform removal of areas of layers is desirable in many cases, as in the investigation of diffusion or implantation profiles, of transition regions in thin multi-layer systems, and in other boundary-layer problems. Even in ionic etching which is not followed by analysis of the removed particles it is usually desirable that the material be removed as evenly as possible.

SUMMARY OF THE INVENTION

The object of the present invention is to provide a system for the removal of material from the surface of a sample which makes use of a high-frequency plasma produced in front of the sample surface and permits uniform material removal with high depth resolution.

In accordance with the invention, this object is accomplished in that a metallic shield which is electrically insulated from the sample and has an opening determining the area to be removed is disposed between the target and the high-frequency plasma, and that the parameters of this arrangement are chosen so that the relation $$U_2 = (U_1^{\frac{1}{2}} + D/C)^{4/3} \text{ (equation 1)}$$

with $$C = \frac{2}{3}\left(\frac{\epsilon_o}{n}\right)^{\frac{1}{2}} \left(\frac{2}{e_o \cdot kT_e}\right)^{\frac{1}{4}}, \quad U_1 = \frac{kT_e}{2e_o} \ln \frac{M_i}{2\pi m_e}$$

holds, wherein:
$U_2$ = Potential difference applied between sample and plasma;
D = spacing of sample surface from shield;
$\epsilon_o$ = dielectric constant of vacuum,
n = density of plasma;
$e_o$ = elementary charge;
k = Boltzmann constant;
$T_e$ = electron temperature;
$M_i$ = atomic mass of the species of ions (plasma ions) used;
$m_e$ = electron mass; and
$\pi$ = 3.14.

With a system of the type outlined above which satisfies these relations, ion-bombardment craters having extremely flat floors of a size corresponding to the opening in the shield will be obtained. Measurements with an accuracy of about 10 Å have shown that even with crater depths of several thousand angstroms a plane crafter floor can be obtained whose unevenness is within the range of the accuracy of measurement. When the relations given above are not satisfied, the craters produced will have concave or convex floors since potential relationships arise in the marginal regions of the opening determining the size of the craters which influence the direction of the ions producing the removal of the material in such a way that craters having plane floors cannot be obtained.

BRIEF DESCRIPTION OF THE DRAWING

Further advantages and details of the invention will now be described with reference to the accompanying drawing which diagrammatically illustrates an embodiment thereof.

DETAILED DESCRIPTION OF THE INVENTION

Shown in the FIGURE is a mount 1 to which the sample 2 is fixed. In front of the free surface of the sample 2 a high-frequency plasma 3 is produced from argon gas, for example, at a pressure of several $10^{-4}$ millibars and so maintained. This may be done by means of an electromagnetic high-frequency field with electron cyclotron wave resonance, for example, as known from Plasma Physics, vol. 16 (1974), pp. 835 to 844.

Disposed between the plasma 3 and the sample 2 is a shield 4 having an opening 5, the shield being electrically insulated from the target 2. The size of the plasma 3 is considerably greater than the opening 5 in the shield 4 to assure uniform density of the plasma 3 in the area of the opening 5.

The target 2 has a negative voltage with respect to the plasma 3, with the result that a space charge sheath builds up between sample and plasma. As a function of the voltage drop over this space charge sheath, positively charged ions from the plasma are accelerated in the direction of the sample and there produce the desired sputtering.

Shield 4 and sample 2 are disposed parallel to each other. The spacing D of the sample surface from the shield 4, including the finite thickness of the shield, is shown. In accordance with the relation given in equation 1, the ion-bombardment voltage $U_2$ at which sample material is laterally removed evenly can be preset by appropriate choice of the spacing D. Through appropriate means, the spacing D can be adjusted to the particular desired value of $U_2$ and hence, through the $U_2$ dependence of the sputter yield, to the desired removal rate at the sample.

In an example of a system in accordance with the invention with which extremely plane-floored craters were produced, an argon plasma of a density of $2.9 \times 10^{16} \text{m}^{-3}$ and an electron temperature of $1.2 \times 10^5$ K was produced at about $8 \times 10^{-4}$ millibars. In proximity to the sample the variations in the density of the plasma amounted to not more than $1.5 \times 10^{-3}$. The spacing D was 1.3 mm. There was a space-charge region of about 0.4 mm between the shield 4 and the plasma 5. The value for $U_2$ to obtain best plane-floored craters then amounts to 378 volts. The opening 5 in the shield 4 which determined the size of the area removed was circular and had a diameter of about 10 mm.

It will be appreciated that the instant specification and claims are set forth by way of illustration and not limitation, and that various modifications and changes may be made without departing from the spirit and scope of the present invention.

What is claimed is:

1. A system for removing material from the surface of a sample comprising: a high-frequency plasma produced in front of the sample surface; a metallic shield disposed between the sample and the high-frequency plasma, electrically insulated from the sample and provided with an aperture determining the sample area to be removed; the parameters of this arrangement are chosen so that the relation $$U_2 = (U_1^{\frac{1}{2}} + D/C)^{4/3}$$

with $$C = \frac{4}{9} \left( \frac{\epsilon_o}{\pi} \right)^{\frac{1}{2}} \left( \frac{2}{e_o \cdot kT_e} \right)^{\frac{1}{4}}, \quad U_1 = \frac{kT_e}{2e_o} \ln \frac{M_i}{2\pi m_e}$$

holds, wherein:
 $U_2$ = Potential difference applied between sample and plasma;
 D = spacing of sample surface from shield;
 $\epsilon_o$ = dielectric constant of vacuum;
 n = density of plasma;
 $e_o$ = elementary charge;
 k = Boltzmann constant;
 $T_e$ = electron temperature;
 $M_i$ = atomic mass of the species of ions (plasma ions) used;
 $m_e$ = electron mass; and
 $\pi$ = 3.14.

2. A system according to claim 1, wherein the spacing D between the sample surface and the shield in a vacuum is adjustable in a defined manner.

3. A method for removing material from the surface of a sample comprising the steps of: producing a high-frequency plasma in front of the sample surface; adjusting the spacing D between a metallic shield provided with an aperture and the sample surface in accordance with the relation $$U_2 = (U_1^{\frac{1}{2}} + D/C)^{4/3}$$

with $$C = \frac{4}{9} \left( \frac{\epsilon_o}{\pi} \right)^{\frac{1}{2}} \left( \frac{2}{e_o \cdot kT_e} \right)^{\frac{1}{4}}, \quad U_1 = \frac{kT_e}{2e_o} \ln \frac{M_i}{2\pi m_e}$$

holds, wherein:
 $U_2$ = Potential difference applied between sample and plasma;
 D = spacing of sample surface from shield;
 $\epsilon_o$ = dielectric constant of vacuum;
 n = density of plasma;
 $e_o$ = elementary charge;
 k = Boltzmann constant;
 $T_e$ = electron temperature;
 $M_i$ = atomic mass of the species of ions (plasma ions) used;
 $m_e$ = electron mass; and
 $\pi$ = 3.14.

* * * * *